(12) United States Patent
Ueno et al.

(10) Patent No.: US 8,784,931 B2
(45) Date of Patent: *Jul. 22, 2014

(54) ULSI WIRING AND METHOD OF MANUFACTURING THE SAME

(75) Inventors: Kazuyoshi Ueno, Kawasaki (JP); Tetsuya Osaka, Tokyo (JP); Nao Takano, Tokyo (JP)

(73) Assignees: Waseda University, Tokyo (JP); Renesas Electronics Corporation, Kanagawa (JP)

( * ) Notice: Subject to any disclaimer, the term of this patent is extended or adjusted under 35 U.S.C. 154(b) by 80 days.

This patent is subject to a terminal disclaimer.

(21) Appl. No.: 12/565,448

(22) Filed: Sep. 23, 2009

(65) Prior Publication Data

US 2010/0006326 A1    Jan. 14, 2010

Related U.S. Application Data

(60) Division of application No. 10/694,172, filed on Oct. 28, 2003, now abandoned, which is a continuation-in-part of application No. 10/154,812, filed on May 28, 2002, now abandoned.

(30) Foreign Application Priority Data

May 28, 2001  (JP) ................................. 2001-158513
Sep. 13, 2001  (JP) ................................. 2001-277602

(51) Int. Cl.
*H05K 1/09*     (2006.01)
*B05D 5/12*     (2006.01)

(52) U.S. Cl.
USPC ....... 427/97.1; 427/97.9; 427/98.1; 427/99.5; 427/304; 427/305; 427/404; 427/405; 427/419.1; 427/437; 427/443.1

(58) Field of Classification Search
USPC ............. 427/97.1, 97.9, 98.1, 99.5, 304, 305, 427/404, 405, 419.1, 437, 443.1
See application file for complete search history.

(56) References Cited

U.S. PATENT DOCUMENTS 3,473,950 A  * 10/1969  Wong ............................... 65/448
3,485,597 A     12/1969  Pearlstein (Continued)

FOREIGN PATENT DOCUMENTS

JP          04297001 A      10/1992
JP        2001-323381 A     11/2001

OTHER PUBLICATIONS

Hawley's Condensed Chemical Dictionary, thirteenth edition, (1997) p. 537.*

(Continued)

*Primary Examiner* — Elena T Lightfoot
(74) *Attorney, Agent, or Firm* — Sughrue Mion, PLLC

(57) ABSTRACT

A method of manufacturing ULSI wiring in which wiring layers are separately formed via a diffusion prevention layer and an insulating interlayer portion made of $SiO_2$. The method comprises the steps of treating, with a silane compound, a $SiO_2$ surface of the insulating interlayer portion on which the diffusion layer is to be formed, performing catalyzation with an aqueous solution containing a palladium compound, forming the diffusion prevention layer by electroless plating, and then forming the wiring layer on this diffusion prevention layer. A capping layer may be formed on the wiring layer by electroless plating. Consequently, a diffusion prevention layer having good adhesive properties can be formed through a simple wet process, and, the wiring layer can directly be formed on this diffusion prevention layer by a wet process. The capping layer can also be directly formed on the wiring layer by electroless plating.

16 Claims, 4 Drawing Sheets

(56) References Cited

U.S. PATENT DOCUMENTS

| | | | |
|---|---|---|---|
| 3,949,141 A * | 4/1976 | Marzocchi et al. | 428/378 |
| 4,262,085 A * | 4/1981 | Ehrich et al. | 430/417 |
| 4,424,805 A * | 1/1984 | Neary | 126/714 |
| 4,503,131 A * | 3/1985 | Baudrand | 428/672 |
| 4,636,255 A | 1/1987 | Tsuda et al. | |
| 4,990,462 A | 2/1991 | Sliwa, Jr. | |
| 5,235,139 A | 8/1993 | Bengston et al. | |
| 5,330,088 A | 7/1994 | Whitlow et al. | |
| 5,357,808 A | 10/1994 | Fung et al. | |
| 5,369,309 A | 11/1994 | Barcrania et al. | |
| 5,821,158 A | 10/1998 | Shishiguchi | |
| 6,060,176 A | 5/2000 | Semkow et al. | |
| 6,153,935 A | 11/2000 | Edelstein et al. | |
| 6,156,413 A * | 12/2000 | Tomari et al. | 428/209 |
| 6,180,523 B1 | 1/2001 | Lee et al. | |
| 6,184,061 B1 | 2/2001 | Wu et al. | |
| 6,335,104 B1 | 1/2002 | Sambucetti et al. | |
| 6,344,309 B2 | 2/2002 | Fukushima et al. | |
| 6,479,384 B2 | 11/2002 | Komai et al. | |
| 6,534,117 B1 * | 3/2003 | Yoshio et al. | 427/97.2 |
| 6,881,671 B2 * | 4/2005 | Jensen et al. | 438/678 |
| 2003/0124255 A1 | 7/2003 | Ueno et al. | |
| 2003/0124263 A1 | 7/2003 | Ueno et al. | |
| 2005/0056828 A1 | 3/2005 | Wada et al. | |

OTHER PUBLICATIONS

Y. Shacham-Diamond et al., "Integrated electroless metallization for ULSI", Electrochimica Acta 44, 1999, pp. 3639-3649 with Abstract.

E.J. O'Sullivan et al., "Electroless deposited diffusion barriers for microelectronics", J. Res. Develop., Sep. 1998, pp. 607-620, vol. 42, No. 5.

* cited by examiner

ULSI WIRING AND METHOD OF MANUFACTURING THE SAME

This application is a Divisional application of U.S. application Ser. No. 10/694,172 filed Oct. 28, 2003 which is a Continuation-In-Part of application Ser. No. 10/154,812 filed May 28, 2002, which claims priority based on Japanese Patent Application No. 2001-158513 filed May 28, 2001 and Japanese Patent Application No. 2001-277602 filed Sep. 13, 2001. The entire disclosures of the prior applications are hereby incorporated by reference.

BACKGROUND OF THE INVENTION (i) Field of the Invention

The present invention relates to ULSI wiring in which wiring layers are separately formed via a diffusion prevention layer with an insulating interlayer portion made of $SiO_2$, and a method of manufacturing the same.

(ii) Description of the Related Art

In ULSI wiring, attendant upon the requirements of an increase in capacity of ULSI and a decrease in cost of manufacture, it is desired to decrease in size of wiring structure and simplify the manufacturing process. From these points, as fabrication techniques for ULSI wiring structures, at present, dual damascene processes are mainstream (hereinafter referred to as prior art 1).

In ULSI wiring according to the prior art 1, in case that a wiring layer is made of Cu (copper), Cu constituting the wiring layer diffuses into an insulating interlayer so that it may bring about bad insulation. Therefore, it is indispensable to interpose a diffusion prevention layer between the wiring layer and the insulating interlayer and thereby prevent Cu from diffusing into the insulating interlayer.

Conventionally, for this diffusion prevention layer, use is made of TaN, TiN, or the like, formed mainly through a sputtering process. Besides, in case that the wiring layer is formed on this diffusion prevention layer by electroplating, in particular, with copper, since the diffusion prevention layer of TaN, TiN, or the like, as described above, is inferior in electrical conductivity, a Cu seed layer or the like as a conductive layer is required.

Although, in dual damascene processes, simplification of process and a decrease in cost by application of wet processes are considered to be advantageous, it is hard to say that the use of dry processes, such as sputtering upon fabrication of the diffusion prevention layer and the conductive layer, is the best technique.

So, a technique is first thinkable in which the diffusion prevention layer is fabricated through an electroless plating process as a wet process. A method of forming such a diffusion prevention layer by electroless plating is reported in, e.g., Electrochimica Acta, vol. 44 (1999), pp. 3639-3649 (hereinafter referred to as prior art 2). For forming a diffusion prevention layer by electroless plating, it is indispensable to give catalysis to the surface of an insulating interlayer. However in the above report, for forming a diffusion prevention layer of COWP, a Co layer is formed as a catalyst layer by sputtering to give catalysis. In this way, in the case of forming the catalyst layer by sputtering, a thickness to some extent is required for keeping adhesive properties between the diffusion prevention layer and the insulating interlayer, and the uniformity of the diffusion prevention layer. Therefore, by this method, further fineness of the ULSI wiring structure is difficult.

Besides, in the above-described process, many steps are required till the fabrication of the wiring layer. In addition, two processes different in phase, such as sputtering and CVD as dry processes, and electroplating as a wet process, must be performed. Therefore, the process is complicated and it is disadvantageous in cost.

Further, a layer of SiN or the like higher in dielectric constant than $SiO_2$, as a capping layer (cap insulating layer), is formed on the wiring layer by chemical vapor deposition (CVD) or the like. In this case, a thickness to some extent is required for keeping the adhesive properties with the wiring layer, and the uniformity and thermal stability of the capping layer. Therefore, the wiring capacity is increased, and further fineness of the wiring structure is difficult.

SUMMARY OF THE INVENTION

The present invention has been made in view of the above circumstances.

It is an object of the present invention to provide a method of manufacturing ULSI wiring, which makes it possible to perform all the formations of the diffusion prevention layer and further the wiring layer and the capping layer through wet processes, and in which the diffusion prevention layer good in adhesion, and further the wiring layer and the capping layer, can be formed through a simple process.

It is another object of the present invention to provide ULSI wiring in which a capping layer good in adhesion, uniformity, and thermal stability is formed as a plating film on the wiring layer.

According to one aspect of the present invention, there is provided a method of manufacturing ULSI wiring in which wiring layers are separately formed via a diffusion prevention layer with an insulating interlayer portion made of $SiO_2$. The method comprises the steps of treating, with a silane compound, an $SiO_2$ surface on which the insulating interlayer portion is to be formed, performing catalyzation with an aqueous solution containing a palladium compound, forming the diffusion prevention layer by electroless plating, and then forming the wiring layer on this diffusion prevention layer. According to this aspect of the present invention, the diffusion prevention layer having high thermal stability and barrier properties.

In the aspect of the present invention, the formation of the diffusion prevention layer by the electroless plating preferably is accomplished by a step of forming metallic cores by use of a neutral or acid electroless plating bath, and a step of forming the diffusion prevention layer by use of an alkaline electroless plating bath. In consequence, even by using the alkaline electroless plating bath, the diffusion prevention layer can be formed without damaging $SiO_2$ and the organic silane layer.

In the aspect of the present invention, when the wiring layer is formed by electroless plating, the diffusion prevention layer formed by the above method plays the role of a catalyst. Hence, it is possible to directly form the wiring layer on the diffusion prevention layer by the electroless plating without performing a treatment such as the catalyzation treatment. In addition, if a metallic film having a low specific resistance is used as the diffusion prevention layer, the wiring layer can also be formed by electroplating. Furthermore, if a capping layer is directly formed on this wiring layer by the electroless plating, the ULSI wiring can be manufactured through all wet processes.

According to another aspect of the present invention, there is provided a manufacturing method of ULSI wiring which comprises the step of directly forming a capping layer on a wiring layer by electroless plating. Here, in the case of this aspect of the present invention, for forming the capping layer, an electroless plating bath as will be described below in detail is preferably used, besides, in case that the wiring layer is made of copper, it preferably comprises the step of removing copper oxide rubbish before electroless plating. As the copper oxide rubbish removing step before electroless plating, it is a wet treatment or the like with an acid aqueous solution without damaging an insulating interlayer, more specifically, a wet treatment with an acid electroless nickel plating bath using a boron-base reducing agent is preferable. By treatment with the acid electroless nickel plating bath using this boron-base reducing agent, preferably not only the removal of the copper oxide layer but also uniform reaction core formation onto the wiring layer is performed at the same time. In this case, it is preferable that the step of forming the capping layer is performed in two stages of the copper oxide layer removal and reaction core formation step with the electroless nickel plating bath using the boron-base reducing agent, and then the step of forming the capping layer by alkaline electroless plating; or it is also preferable that the copper oxide layer removal and reaction core formation step with the electroless nickel plating bath using the boron-base reducing agent, and the step of forming the capping layer are performed in one stage; or it is preferable that the step of forming the capping layer is performed in two stages of the copper oxide layer removal and the step of forming the capping layer by alkaline electroless plating containing no alkali metal.

According to still another aspect of the present invention, there is provided ULSI wiring in which wiring layers are separately formed via a diffusion prevention layer with an insulating interlayer portion made of $SiO_2$ and a capping layer is formed on the wiring layers. In the ULSI wiring, the capping layer is made of a nickel-tungsten-phosphorus, nickel-rhenium-phosphorus, or nickel-boron plating film. In this case, the capping layer is preferably formed by nickel-tungsten-phosphorus electroless plating, nickel-rhenium-phosphorus electroless plating, or nickel-boron electroless plating. According to this aspect of the present invention, this capping layer is good in adhesion, uniformity, and thermal stability.

According to yet another aspect of the present invention, there is provided a method of manufacturing ULSI wiring which comprises the step of applying nickel-tungsten-phosphorus electroless plating, nickel-rhenium-phosphorus electroless plating, or nickel-boron electroless plating to wiring layers of ULSI wiring in which the wiring layers are separately formed via a diffusion prevention layer with an insulating interlayer portion made of $SiO_2$, thereby forming a capping layer on the wiring layers.

DESCRIPTION OF THE PREFERRED EMBODIMENTS

Before describing embodiments of the present invention, for making the understanding of the present invention easy, manufacturing methods of ULSI wiring according to prior arts will be described with reference to FIGS. 1 and 2.

Figure 1:
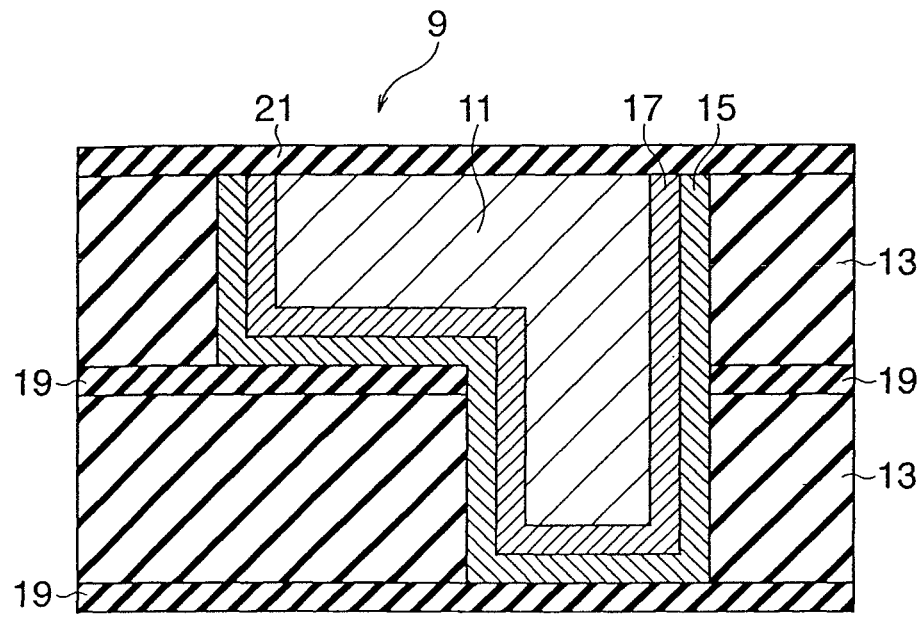
FIG. 1 is a conceptional view illustrating one example of ULSI wiring manufactured through a conventional dual damascene process.

As illustrated in FIG. 1, in ULSI wiring according to the prior art 1, particularly in case that a wiring layer 11 is made of Cu (copper), if Cu constituting the wiring layer 11 diffuses into an insulating interlayer 13, it may bring about bad insulation. Therefore, it is indispensable to interpose a diffusion prevention layer 15 between the wiring layer 11 and the insulating interlayer 13 and thereby prevent Cu from diffusing into the insulating interlayer 2.

Conventionally, for this diffusion prevention layer 15, use is made of TaN, TiN, or the like, formed mainly through a sputtering process. In case that the wiring layer 11 is formed on this diffusion prevention layer 15 by electroplating, in particular, with copper, the diffusion prevention layer 15 of TaN, TiN, or the like, as described above, is inferior in electrical conductivity. Accordingly, a Cu seed layer or the like as a conductive layer 17 is required. Note that reference numeral 19 in the figure denotes an etching stop, and reference numeral 21 in the figure denotes a cap insulating layer (SiN).

Although, in dual damascene processes, simplification of process and a decrease in cost by application of wet processes are considered to be advantageous, it is hard to say that the use of dry processes such as sputtering upon fabrication of the diffusion prevention layer and the conductive layer is the best technique.

Figure 2:
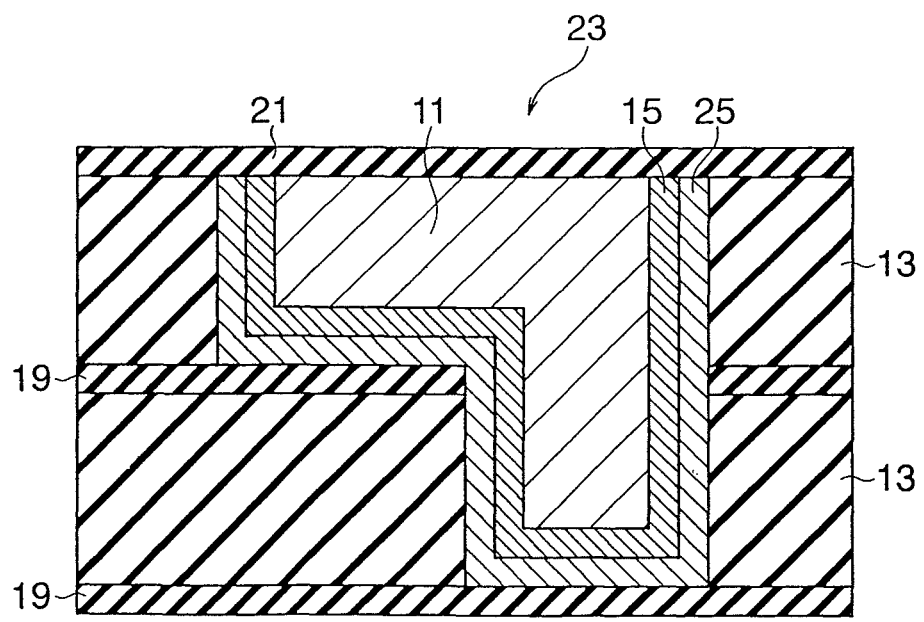
FIG. 2 is a conceptional view illustrating another example of ULSI wiring manufactured through a conventional dual damascene process.

So, as illustrated in FIG. 2, a technique in which the diffusion prevention layer is fabricated through an electroless plating process as a wet process has been thought out in the prior art 2.

Referring to FIG. 2, for forming a diffusion prevention layer by electroless plating according to the prior art 2, although it is indispensable to give catalysis to the surface of the insulating interlayer 13, in one according to the prior art 2, for forming the diffusion prevention layer 15 of COWP, as a catalyst layer 25, a Co layer is formed by sputtering to give catalysis. In this way, in the case of forming the catalyst layer 15 by sputtering, for keeping the adhesive properties between the diffusion prevention layer and the insulating interlayer and the uniformity of the diffusion prevention layer, a thickness to some extent is required. Therefore, by this method, further fineness of the ULSI wiring structure is difficult.

In the above-described process, many steps are required till the fabrication of the wiring layer. In addition, two processes different in phase, such as sputtering and CVD as dry processes, and electroplating as a wet process, must be performed. Therefore, the process is complicated and it is disadvantageous in cost.

Further, a layer of SiN or the like higher in dielectric constant than $SiO_2$, as a capping layer (cap insulating layer), is formed on the wiring layer by chemical vapor deposition (CVD) or the like. In this case, a thickness to some extent is required for keeping the adhesive properties with the wiring layer, and the uniformity and thermal stability of the capping layer. Therefore, it has disadvantages that the wiring capacity is increased and further fineness of the wiring structure is difficult.

Now, preferred embodiments of the present invention will be described with reference to FIGS. 3 to 9.

Methods of manufacturing ULSI wiring according to the embodiments of the present invention are based on a dual damascene process.

Figure 3:
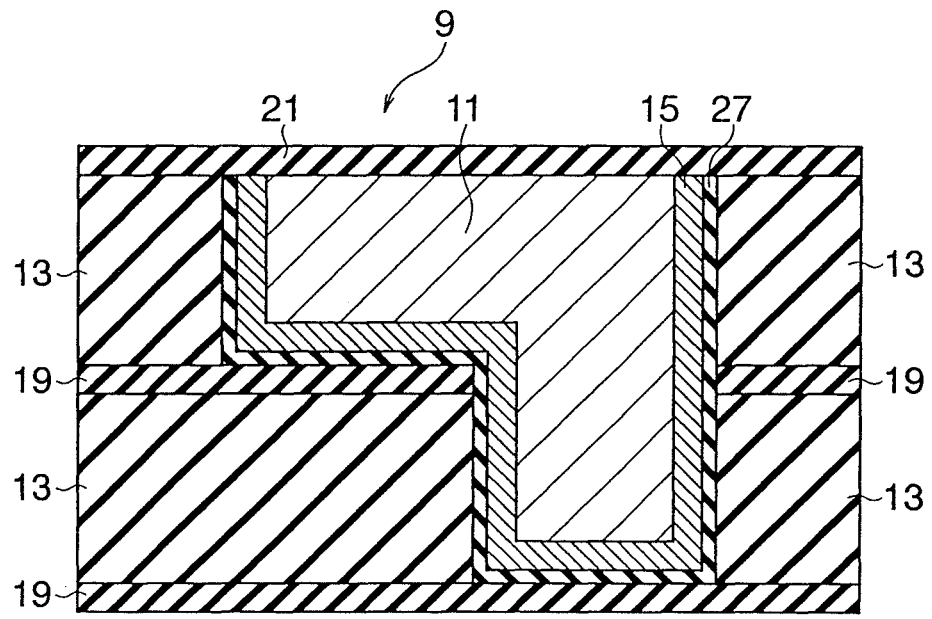
FIG. 3 is a conceptional view illustrating ULSI wiring manufactured by a manufacturing method according to one embodiment of the present invention.

As illustrated in FIG. 3, in an embodiment of the present invention, first, the surface of the insulating interlayer 13 made of $SiO_2$ is treated with an organic silane compound. By this, an adhesion layer 27 preferably made of a monomolecular layer of the organic silane compound.

In this case, as the organic silane compound, although, for example, silane coupling agents such as silane having amino groups and alkoxy groups such as N-(2-aminoethyl)-3-aminopropyl trimethoxy silane, 3-aminopropyl trimethoxy silane, 2-(trimethoxysilyl)ethyl-2-pyridine, (aminoethyl)-phenethyl trimethoxy silane, or the like, and further silane having epoxy groups and alkoxy groups such as γ-glycidyl propyl trimethoxy silane or the like, can be mentioned, particularly from the points of adhesive properties and catalysis giving properties, a silane coupling agent having amino groups and alkoxy groups is preferable.

The above organic silane compound is used as a solution in which it is dissolved in a solvent, and treated by dipping the substrate having the insulating interlayer made of the above $SiO_2$ in this. In this case, as the solvent, although an alcoholic solvent such as methanol, ethanol, or the like, a hydrocarbonic solvent such as toluene or the like, are used, preferably, an alcoholic solvent, in particular, ethanol is preferable.

Although depending upon the time in which the substrate is dipped, the concentration of the above organic silane is preferably 0.2-2 vol. %, particularly, about 1 vol. % is preferable.

Besides, this solution is used in the temperature range of, preferably, 20-90° C., particularly, 40-70° C., more particularly, 50-60° C. Note that the dipping time is preferably 30 minutes to 10 hours, particularly, 1-6 hours, more particularly, 2-6 hours.

In the present invention, next, the $SiO_2$ surface is catalyzed with a solution containing a palladium (Pd) compound. In this way, by dipping the substrate in a silane compound, particularly, a silane compound solution having amino groups in particular, preferably, a self-organizing monomolecular layer in chemical bond with the $SiO_2$ surface is formed on the $SiO_2$ surface of the substrate, and further, by dipping this substrate in an aqueous solution containing a palladic salt, amino groups catch Pd, and it enables catalyzation of the $SiO_2$ surface. That is, although the surface that the monomolecular layer constituted by the silane compound, in particular, silane molecules having amino groups, on $SiO_2$ of the substrate, has good smoothness, by dipping in the aqueous solution containing the palladic salt, catalyzation of the surface becomes possible.

Here, as the aqueous solution (catalysis giving liquid) containing a palladium compound, an acid aqueous solution containing a water-soluble palladium compound such as $PdCl_2$, $Na_2PdCl_4$, or the like, is suitably used. In this case, the concentration of the palladium compound is preferably 0.01-0.5 g/L, particularly, 0.04-0.1 g/L, more particularly, 0.04-0.05 g/L, as palladium. In this catalysis giving liquid, at need, a buffer such as 2-morpholinoethane sulfonic acid or the like can be added, or a stabilizer such as NaCl or the like can be added. Besides, pH of this catalysis giving liquid is preferably set at 2-6, particularly, 4-6, more particularly, about 5.

Although the catalyzation treatment using the above catalysis giving liquid is performed in the temperature range of, preferably, 10-40° C., particularly, 20-30° C., more particularly, 20-25° C., usually the room temperature suffices. Note that the dipping time is preferably 1-60 minutes, particularly, 10-30 minutes.

Next, on $SiO_2$ to which the above catalyzation treatment has been applied, as illustrated in FIG. 3, a diffusion prevention layer 15 is formed by electroless plating.

Here, in case that an adhesion layer 27 is formed onto $SiO_2$ by the organic silane monomolecular layer, if an alkaline electroless plating bath is directly used in the subsequent electroless plating process, since, by the $SiO_2$ surface being damaged, the adhesion layer 27 is also damaged. Therefore, an electroless plating bath not more than neutrality must be used.

However, when formation of a metallic film effective as the diffusion prevention layer 15 is considered, such a restriction is very disadvantageous.

So, in the present invention, it is preferable to adopt a method in which, first, as the first step, metal cores are formed with a neutral or acid electroless plating bath, and then, as the second step, formation of the diffusion prevention layer using an alkaline electroless plating bath is performed by the use of self-catalysis functions of the metal cores themselves. If this process is used, even using the highly alkaline electroless plating bath in the second step, there is no damage on the adhesion layer, and fabrication of the diffusion prevention layer exhibiting good adhesive properties becomes possible. In this way, by forming the metal cores in the first step, since the restriction of the electroless plating bath used upon diffusion prevention layer formation, it can be said that this is a very effective technique.

Here, as the above neutral or acid electroless plating bath, use is suitably made of electroless nickel plating bath using, as a reducing agent, hypophosphite, such as sodium hypophosphite or the like, amine borane, such as dimethylamine borane or the like, or the like, at pH of 4-7, particularly, 4-5, 5, more particularly, 4.4-5. As this neutral or acid electroless nickel plating bath, one having a known composition is used, and a commercial item can be used.

Besides, plating conditions using this neutral or acid electroless nickel plating bath can be a normal method according to this plating bath, though being properly selected, for example, the plating temperature is 70-95° C., particularly at 70-92° C., plating is preferably performed for 5-60 seconds, particularly, for 10-30 seconds, more particularly, for 10-15 seconds, and the film thickness of the plating film by this plating is preferably set at 5-25 nm, particularly, 5-15 nm.

On the other hand, as the alkaline electroless plating bath, it is preferable to use an electroless nickel-tungsten-phosphorus bath, an electroless nickel-rhenium-phosphorus bath, an electroless nickel-boron bath, or the like. In this way, the substrate to which the above catalyzation has been applied is (a) by dipping in the neutral or acid electroless nickel plating bath, after deposition cores of nickel are formed, (b) by dipping in the alkaline electroless nickel-tungsten-phosphorus bath, electroless nickel-rhenium-phosphorus bath, or electroless nickel-boron bath, fabrication of a nickel alloy layer as the diffusion prevention layer is suitable. In this case, by performing the step of (a), as described above, metal film formation from such an alkaline electroless plating bath as (b) becomes possible, if the alkaline plating bath is used without performing the step of (a), since the substrate is damaged by the alkaline aqueous solution, the organic silane monomolecular layer is also damaged, and there is a fear of hindering the subsequent electroless plating process. A nickel-tungsten-phosphorus or nickel-rhenium-phosphorus thin film fabricated by the above step exhibits good adhesion, and by the subsequent anneal treatment, the adhesive properties are further improved.

Note that the plating layer formed with the above electroless nickel-tungsten-phosphorus bath or electroless nickel-rhenium-phosphorus bath is, from the point of diffusion prevention effect or the like, preferably one in which the tungsten or rhenium content is 40-80 wt. %, the phosphorus content is 0.1-1.0 wt. %, and the residual is nickel. Besides, the plating layer formed with the electroless nickel-boron bath is preferably one in which the boron content is 5-10 wt. % and the residual is nickel.

Here, as the electroless nickel-tungsten-phosphorus bath or electroless nickel-rhenium-phosphorus bath, one is preferable which contains 0.02-0.1 mole/L, particularly, about 0.075 mole/L of a water-soluble nickel salt, e.g., nickel sulfate or the like, 0.005-0.2 mole/L, particularly, 0.030-0.106 mole/L of a water-soluble tungstate or rhenate, such as sodium tungstate, ammonium perrhenate, or the like, and 0.09-0.1 mole/L, particularly, 0.094-0.1 mole/L of a hypophosphite, such as sodium hypophosphite or the like, as a reducing agent. As the electroless nickel-boron bath, one is preferable which contains 0.05-0.2 mole/L, particularly, about 0.1 mole/L of a water-soluble nickel salt, e.g., nickel sulfate or the like, and 0.025-0.1 mole/L, particularly, about 0.05 mole/L of amine borane such as dimethylamine borane or the like, as a reducing agent. Besides, these electroless plating baths preferably further contain 0.034-0.4 mole/L, particularly, 0.135-0.2 mole/L of a complexing agent such as carboxylic acid such as citric acid, tartaric acid, succinic acid, malonic acid, malic acid, gluconic acid, or the like, or its salt, or an ammonium salt such as ammonium sulfate or the like. In the baths, at need, a pH-conditioner, a buffer, a stabilizer, or the like, may be added.

pH of the above plating baths can be set in the range of 7.4-10, particularly, 8.5-9.5.

Although plating conditions are properly selected, plating can be performed at 80-90° C., particularly, about 90° C., for 1-30 minutes, particularly, 3-15 minutes, more particularly, 3-8 minutes, and the thickness of the diffusion prevention layer is preferably set at 50-100 nm, particularly, about 50 nm.

Note that the present invention preferably adopts a two-stage plating method in which, after plating with a neutral or acid electroless plating bath, plating is performed with an alkaline electroless plating bath. However, it is not limited to this. The diffusion prevention layer can be formed by a single-stage plating method using a neutral or acid electroless plating bath. Particularly, in case that a neutral or acid bath (pH=4-7) is used as the above nickel-tungsten-phosphorus bath, nickel-rhenium-phosphorus bath, or nickel-boron bath, the diffusion prevention layer can be formed by a single-stage plating method with this plating bath.

Note that, after forming the diffusion prevention layer as described above, it is preferable to apply a heating treatment at 300-450° C., particularly, 300-350° C., for 10-30 minutes, particularly, 25-30 minutes, and thereby the adhesive properties can be further improved. However, since a heating step is always included in ULSI wiring manufacturing process, even if no heating treatment step is performed here, finally, the improvement of the adhesive properties can be intended.

In a process of manufacturing ULSI wiring before the diffusion prevention layer is formed on the organic silane layer and after the organic silane layer is deposited on the first insulation layer, the organic silane layer is subjected to heat-decomposition by heating of the process at a temperature, for example 300° C. or more in the process to form an adhesion layer containing at least one of silicon (Si) and carbon (C).

Furthermore, in a process of manufacturing ULSI wiring after the diffusion prevention is formed on the organic silane layer, the adhesion layer heat-decomposed at the temperature, for example 300° C. or more in the process from the organic silane layer to form silicon (Si) and carbon (C) and which Si and C are further diffused into the diffusion prevention layer by heating to form a diffusion prevention layer containing at least one of Si and C.

In the present invention, after forming the diffusion prevention layer in this way, a wiring layer 11 can be formed directly on this as illustrated in FIG. 3. In this case, the wiring layer 11 is preferably formed by electroless copper plating or electroplating with copper (note that, in FIG. 3, reference numeral 19 denotes an etching stop made of SiN or the like, and reference numeral 21 is a cap insulating layer made of SiN). That is, the diffusion prevention layer fabricated by an electroless plating method as described above has catalyst activity to another electroless plating bath. Therefore, in FIG. 4, the step of forming a conductive layer for copper plating layer fabrication denoted by reference numeral 15 is eliminated, and subsequently, fabrication of the copper wiring layer 11 becomes possible by electroless copper plating. Further, if the diffusion prevention layer 15 is a metallic film low in specific resistance, fabrication of the copper wiring layer becomes possible not only by electroless plating but also electroplating with copper, and it can achieve the manufacture of the ULSI wiring layer by all wet processes.

Here, as electroless copper plating, using a known electroless copper plating bath in which formalin, hypophosphite, further, dimethylamine borane, $NaBH_4$, or the like is used as a reducing agent, plating can be performed under known conditions in accordance with the kind of the plating bath. Besides, as for electroplating with copper, using known electro-copper-plating bath, such as a copper-sulfate bath, a copper-borofluoride bath, a copper-pyrophosphate bath, or the like, plating can be performed under known conditions in accordance with the kind of the plating bath, and the wiring layer 11 can be formed by a normal method.

Further, in the present invention, after forming the wiring layer 11 as described above, as illustrated in FIG. 4, further, a metallic plating thin film can be formed on this as a capping layer 29 like the diffusion prevention layer using an electroless plating bath, such as the above electroless nickel-tungsten-phosphorus bath, electroless nickel-rhenium-phosphorus bath, electroless nickel-boron bath, or the like. In the present invention, a step of forming a metallic plating thin film on the substrate by no use of forming the catalyst layer and with contacting to the substrate will be referred to as "direct forming the metallic plating film on the substrate". By this, without performing film formation of the cap insulating layer as shown by reference numeral 21 in FIG. 3, although film formation of an insulating interlayer in the upper layer can be performed as illustrated in FIG. 4, the wiring layer 11 forming the capping layer 29 by the above method is not limited to one formed by the above-described method, and also applicable is to form on the wiring layer 11 of the ULSI wiring formed by a conventionally known method.

Figure 4:
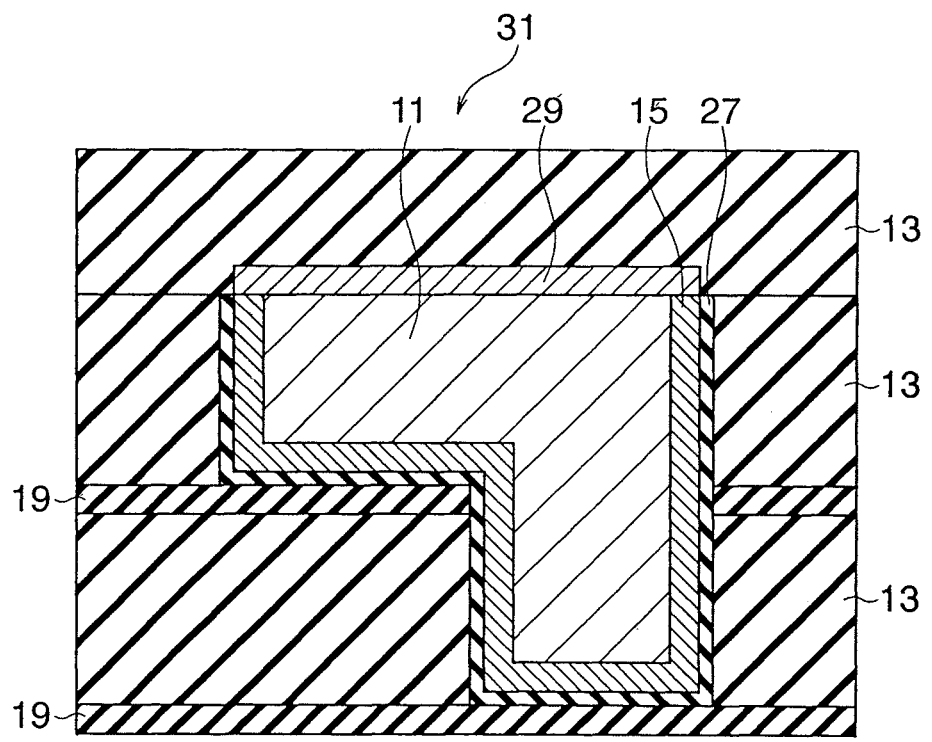
FIG. 4 is a conceptional view illustrating ULSI wiring manufactured by a manufacturing method according to another embodiment of the present invention.

Note that, since the film thickness of the capping layer 29 of FIG. 4 is thin, the step with the upper surface of the insulating interlayer 13 of the middle step is little and it is substantially flat. For further flattening, a structure may be in which the wiring layer upper surface is formed somewhat lower than the upper surface of the insulating interlayer 13 of the middle step. Furthermore, the structure may be in which the capping layer 29 is formed on this so that its upper surface is at the same height as the insulating interlayer 13 of the middle step. However, the structure is not limited to these.

At this time, in the case of using an alkaline electroless plating bath, it is preferable to first treat with the acid electroless nickel-boron bath. Note that, in this case, its pH is preferably 4-6, particularly, 4-5. Since this electroless nickel-boron bath is acid, with removing oxide rubbish on the copper surface, it becomes possible to form reaction cores of electroless nickel-tungsten-phosphorus plating, electroless nickel-rhenium-phosphorus plating, or electroless nickel-boron plating, which will be performed subsequently. In the report in the above-mentioned Electrochimica Acta and a report in IBM Journal Research and Development, vol. 42 (1998), pp. 607-620, although a treatment with a Pd aqueous solution is performed when the capping layer 29 is formed on Cu by electroless plating, in the process according to the present invention, it becomes possible to decrease one stage of the treatment with the Pd aqueous solution which is considered to be desirable that it is omitted in the semiconductor process as far as possible. In the case of using acid electroless nickel-boron plating for forming the capping layer 29, it has the above-mentioned advantage, and also the plating process can be performed in one stage. In the report of Electrochimica Acta, although the copper wiring layer 11 surface fabricated by electroless plating is treated with fluoric acid and a palladium chloride aqueous solution, in the present invention, also the fluoric acid treatment which is considered to damage the insulating interlayer 13 can be eliminated.

In the case of forming the capping layer 29 with the electroless nickel-tungsten-phosphorus plating bath or electroless nickel-rhenium-phosphorus plating bath, a two-stage process is preferable in which, after the treatment with the acid electroless nickel-boron plating bath as described above, plating is performed with the alkaline electroless nickel-tungsten-phosphorus plating bath or alkaline electroless nickel-rhenium-phosphorus plating bath. However, it is not limited to this. The capping layer 29 can be formed through a single-stage process by the use of an electroless plating bath containing dimethylamine borane or the like which is acid and has activity on the copper surface as a reducing agent.

Besides, as the method for forming the capping layer 29, a method also can be used in which oxide rubbish on the copper surface is removed with an acid aqueous solution such as sulfuric acid or the like, and then the capping layer 29 is formed with an electroless plating bath. In this case, as the electroless plating bath, an alkaline electroless plating bath, in particular, an alkaline electroless nickel-boron plating bath, is preferable, and further, the plating bath preferably contain no alkali metal such as sodium, potassium, or the like. If a plating bath containing alkali metal is used, the gate insulating film made of $SiO_2$ is contaminated with the alkali metal and there is a case that it causes deterioration of transistor characteristics. Note that, in this case, pH of the plating bath can be controlled with a base containing no alkali metal, such as TMAH (tetramethylammonium hydroxide).

Note that, as for the electroless plating bath in the case of forming the capping layer 29, as the electroless nickel-tungsten-phosphorus bath or electroless nickel-rhenium-phosphorus bath, one is preferable which contains 0.02-0.1 mole/L, particularly, about 0.075 mole/L of a water-soluble nickel salt, e.g., nickel sulfate or the like, 0.005-0.2 mole/L, particularly, 0.030-0.106 mole/L of a water-soluble tungstate or rhenate such as sodium tungstate, ammonium perrhenate, or the like, and 0.09-0.1 mole/L, particularly, 0.094-0.1 mole/L of a hypophosphite such as sodium hypophosphite or the like, as a reducing agent.

As the electroless nickel-boron bath, one is preferable which contains 0.05-0.2 mole/L, particularly, about 0.1 mole/L of a water-soluble nickel salt, e.g., nickel sulfate or the like, and 0.025-0.1 mole/L, particularly, about 0.05 mole/L of amine borane such as dimethylamine borane or the like, as a reducing agent. Besides, these electroless plating baths preferably further contain 0.034-0.4 mole/L, particularly, 0.135-0.2 mole/L of a complexing agent such as carboxylic acid such as citric acid, tartaric acid, succinic acid, malonic acid, malic acid, gluconic acid, or the like, or its salt, or an ammonium salt such as ammonium sulfate or the like. In the baths, at need, a pH-conditioner, a buffer, a stabilizer, or the like, may be added.

pH of the above plating baths can be set in the range of 7.4-10, particularly, 8.5-9.5.

Although plating conditions are properly selected, plating can be performed at 80-90° C., particularly, about 90° C., for 1-30 minutes, particularly, 3-15 minutes, more particularly, 3-8 minutes, and the thickness of the capping layer 29 is preferably set at 5-100 nm, particularly, about 20 nm.

The capping layer 29 obtained by the above method is, from the point of thermal stability or the like, in the case of nickel-tungsten-phosphorus or nickel-rhenium-phosphorus, preferably one in which the tungsten or rhenium content is 40-80 wt. %, the phosphorus content is 0.1-1.0 wt. %, and the residual is nickel. On the other hand, in the case of nickel-boron, it is preferably one in which the boron content is 0.1-10 wt. % and the residual is nickel.

Well, although specific examples of the present invention will be described, the present invention is not limited by this.

EXAMPLES 1-3

By washing an $SiO_2$ (film thickness: 30 nm)/Si substrate by an SPM treatment [$H_2SO_4:H_2O_2$=4:1 (volume ratio), 80° C., 10 minutes], and dipping this substrate in an N-(2-aminoethyl)-3-aminopropyl trimethoxy silane ethanol solution having the composition shown in Table 1, at 50° C. for four hours, an organic silane monomolecular layer was formed. Next, by dipping it in ethanol, removing surplus organic silane molecules by supersonic washing, and subsequently, dipping it in an aqueous solution containing $Na_2PdCl_4$ at the component concentration shown in the below Table 2, at the room temperature for 10-30 minutes, the surface was catalyzed. The substrate pulled up from the above solution was washed with ultrapure water and kept in ultrapure water.

Next, as the first step, this substrate was dipped in an electroless plating bath whose pH had been controlled to 4.5 and which had the composition shown in Table 3, at 70-90° C. for 10-15 seconds to form nickel cores on the surface. Subsequently, as the second step, this substrate was dipped in an electroless plating bath whose pH had been controlled to 9.0 and which had the component concentration shown in Table 4, for 3-8 minutes. As a result, a diffusion prevention layer was obtained. The whole surface of the substrate obtained had uniform metallic luster.

TABLE 1

|  | Content (ml/100 ml) |
|---|---|
| N-(2-aminoethyl)-3-aminopropyl trimethoxy silane | 1.0 |
| Ethanol | 99.0 |

TABLE 2

|  | Component Conc. (g/L) |
| --- | --- |
| NaCl | 0.5844 |
| 2-Morpholinoethane sulfonic acid | 2.132 |
| $Na_2PdCl_4$ | 0.1140 |
| pH (adjusted with NaOH) | 5.0 |

TABLE 3

|  | Component Conc. (mol/L) |
| --- | --- |
| $NaH_2PO_2 \cdot H_2O$ | 0.15 |
| $(NH_4)_2SO_4$ | 0.50 |
| Sodium citrate | 0.20 |
| $NiSO_4 \cdot 6H_2O$ | 0.10 |

TABLE 4

| Component Conc. (mol/L) | Example 1 | Example 2 | Example 3 |
| --- | --- | --- | --- |
| $(NH_4)_2SO_4$ | 0.227 | — | — |
| Sodium citrate | 0.135 | 0.400 | 0.2 |
| $NiSO_4$ | 0.027 | 0.0750 | 0.1 |
| $Na_2WO_4$ | 0.106 | — | — |
| $(NH_4)_2ReO_4$ | — | 0.0300 | — |
| $NaH_2PO_2$ | 0.100 | 0.100 | — |
| Dimethylamine borane | — | — | 0.05 |
| pH (adjusted with NaOH) | 9.0 | 9.0 | 9.0 |

Note that, in the above example, if the first step was omitted and the second step was performed, it resulted in either that the metal deposition from the alkaline electroless plating bath of the above Table 4 became partial or that no deposition was observed.

Figure 5:
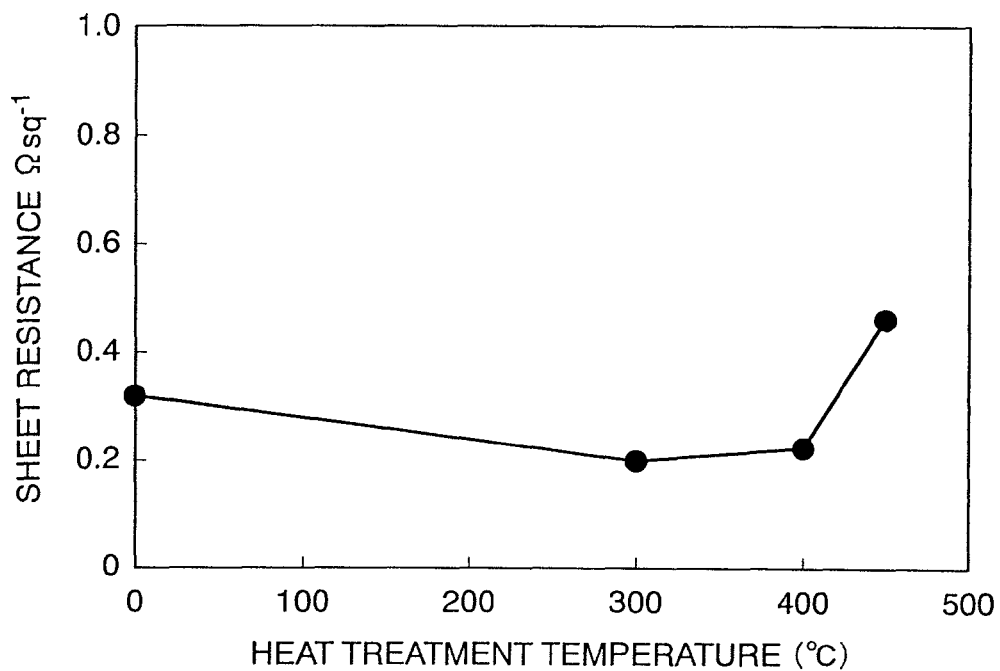
FIG. 5 is a graph showing the thermal stability valuation of a nickel-rhenium-phosphorus diffusion prevention layer.

Besides, as shown in FIG. 5, the nickel-rhenium-phosphorus diffusion prevention layer fabricated on $SiO_2$ exhibited good thermal stability to 400° C., and it was recognized to have a sufficient performance as the diffusion prevention layer.

After the above alkaline electroless plating, copper plating was performed using the electroless copper plating bath having the composition shown in the below Table 5, or the electroless steel plating bath having the composition shown in the below Table 6. In either case, good plating could be directly performed, and it was recognized to be able to form a wiring layer by direct copper plating.

TABLE 5

|  | Component Conc. |
| --- | --- |
| $CuSO_4 \cdot 5H_2O$ | 2 (g/$dm^3$) |
| EDTA | 6 (g/$dm^3$) |
| DMAB | 4 (g/$dm^3$) |

TABLE 6

|  | Component Conc. |
| --- | --- |
| $CuSO_4 \cdot 5H_2O$ | 0.24 (mol/L) |
| $H_2SO_4$ | 1.8 (mol/L) |
| CL- | 50 (mol/L) |
| Polyethylene glycol | 300 (mol/L) |
| Bis(3-sulfopropyl) disulfide | 1.0 (mol/L) |
| Janus Green B | 1.0 (mol/L) |

After the above copper plating, with alcohol, such as ethanol, isopropyl alcohol, or the like, organic matter pollution on the copper surface was washed. Then, by the use of one in which pH of the electroless nickel-boron plating bath shown in the above Table 4 had been controlled to be acid (pH 5.0), reaction cores were formed for removal of oxide rubbish on the copper surface and electroless nickel-tungsten-phosphorus plating or electroless nickel-rhenium-phosphorus plating. By these treatments, the copper surface became pure and reaction active. Subsequently, when the above alkaline electroless plating was performed and fabrication of a capping layer 29 was performed, it exhibited good thermal stability to 450° C., and it was made clear to have a sufficient performance as the capping layer 29. Besides, after the above organic manner pollution washing step, using one in which pH of the electroless nickel-boron plating bath shown in the above Table 4 had been controlled to be acid, also in the case of performing removal of oxide rubbish on the copper surface and fabrication of the capping layer in a single stage, it exhibited good thermal stability to 400° C., and it was made clear to have a sufficient performance as the capping layer 29.

Figure 6:
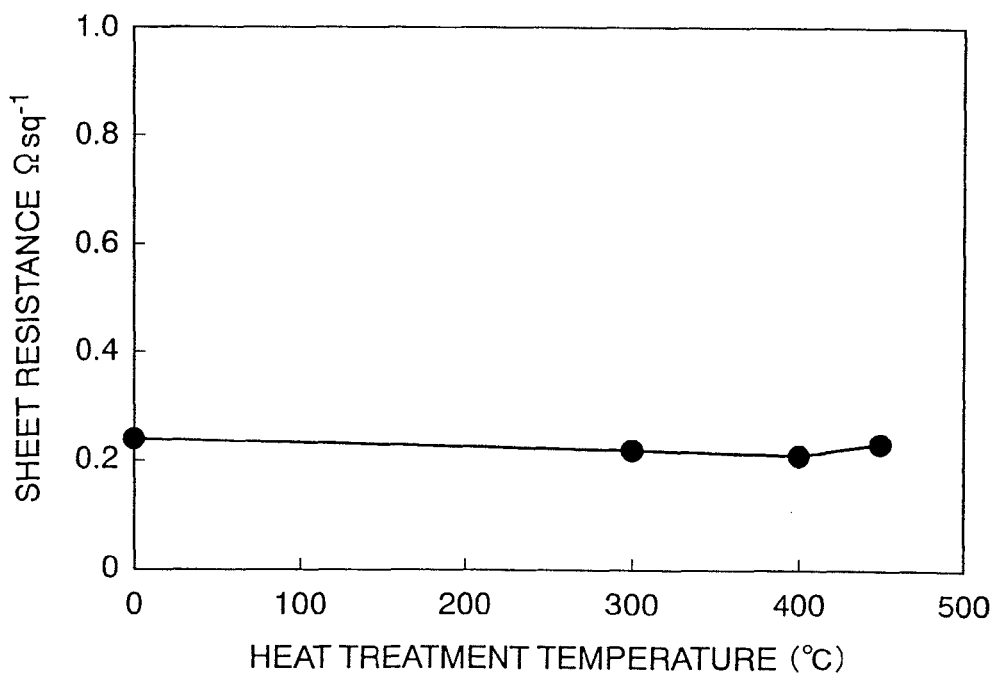
FIG. 6 is a graph showing the thermal stability valuation of a nickel-boron capping layer.

Besides, after the above-described copper plating, with alcohol such as ethanol, isopropyl alcohol, or the like, organic matter pollution on the copper surface was washed. Then, oxide rubbish on the copper surface was removed by dipping it in 10% sulfuric acid aqueous solution. By the use of the electroless nickel-boron plating bath shown in the above Table 4, fabrication of the capping layer 29 was performed by electroless plating. As shown in FIG. 6, the capping layer exhibited good thermal stability to 450° C., and it was made clear to have a sufficient performance as the capping layer 29.

Figure 7:
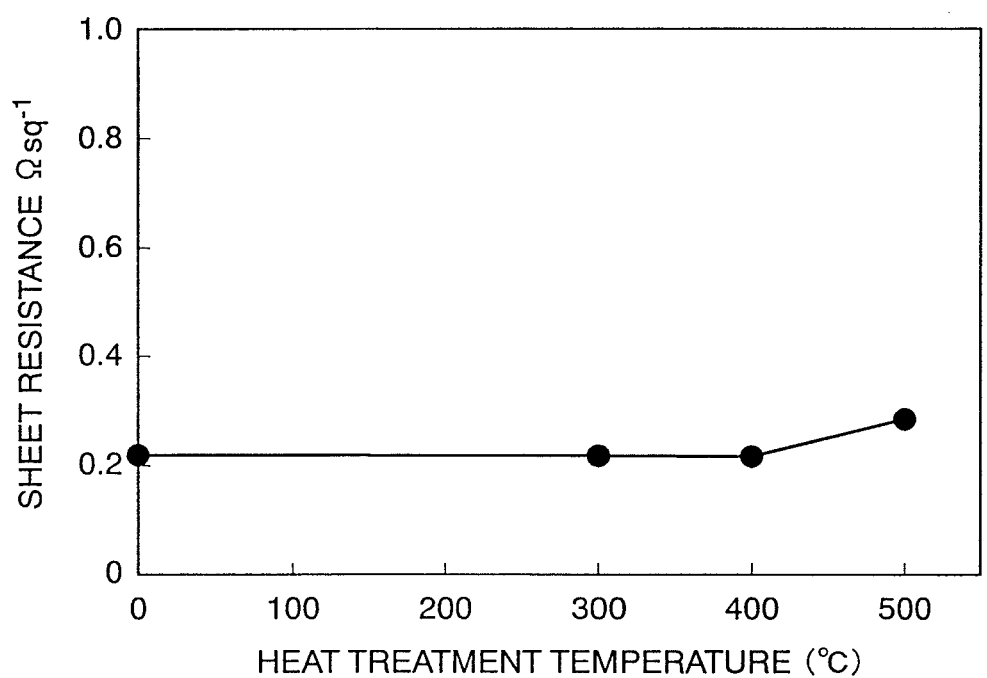
FIG. 7 is a graph showing the thermal stability valuation of a nickel-boron capping layer fabricated with an electroless plating bath containing no alkali metal.

Further, after the above-described copper plating, the above organic matter pollution washing and oxide rubbish removal step on the copper surface was applied. By the use of the electroless nickel-boron plating bath containing no alkali metal shown in Table 7, fabrication of the capping layer 29 was performed by electroless plating. As shown in FIG. 7, the capping layer 29 exhibited good thermal stability to 400° C., and it was made clear to have a sufficient performance as the capping layer 29.

TABLE 7

|  | Component Conc. (mol/L) |
| --- | --- |
| Citrate | 0.2 |
| $NiSO_4$ | 0.1 |
| DMAB | 0.05 |
| pH (adjusted by TMAH) | 9.0 |

As described above, according to the present invention, the diffusion prevention layer having good adhesive properties can all be formed through a simple process by wet processes, and further, the wiring layer can be formed on this diffusion prevention layer directly by the wet process. The capping layer can directly be formed on this wiring layer by the wet process. However, in the case of attaching the capping layer onto the wiring layer, the diffusion prevention layer of the lower layer is not limited to formation by the wet process.

In the above-embodiment, use is made of a silicon dioxide ($SiO_2$) layer, as the first and the second insulating internal layers. Furthermore, as the first and the second insulating internal layers, use may be made of a low dielectric layer, such as a hydrogen silsesquiozane layer (HSQ), a silicon oxycarbide (SiOC) layer, and the like.

Furthermore, in the above-embodiment, use is made of a plating film, such as a nickel-tungsten-phosphorus plating film, a nickel-rhenium-phosphorus plating film, and a nickel-boron film as the diffusion protection film and the capping layer. In place of the plating films as the diffusion protection film, use may be made of a conventional plating film, such as a cobalt-tungsten-phosphorus film, a cobalt-tungsten-boron film, and a cobalt metal film.

What is claimed is:

1. A method of manufacturing ULSI wiring in which wiring layers are separately formed via a single diffusion prevention layer formed on a surface of a hollowed portion of an insulating interlayer made of $SiO_2$, said method comprising the steps of:
    treating a $SiO_2$ surface on the hollowed portion of the insulating interlayer with an organic silane compound to form an organic silane monomolecular layer;
    performing catalyzation of the treated $SiO_2$ surface with an aqueous solution containing a palladium compound;
    thereafter forming the single diffusion prevention layer by a electroless plating method using a plating bath selected from the group consisting of an electroless nickel-tungsten-phosphorous bath, and an electroless nickel-rhenium-phosphorous bath, wherein in the nickel-tungsten-phosphorus bath and the nickel-rhenium-phosphorus bath the tungsten or rhenium content is 40-80 wt %, the phosphorous content is 0.1 to 1.0 wt %, and the residual is nickel; and
    then forming the wiring layer on the single diffusion prevention layer.

2. The method according to claim 1, wherein the single diffusion prevention layer is formed by a single-stage electroless plating method with the plating bath being in a neutral or acid condition.

3. The method according to claim 1, further comprising:
    forming a metallic core by use of a neutral or acid electroless plating bath after performing catalyzation and before forming the single diffusion layer.

4. The method according to claim 3, wherein the neutral or acid electroless plating bath is an electroless nickel plating bath.

5. The method according to claim 1, wherein the wiring layer is formed directly on the single diffusion prevention layer by use of electroless copper plating or electroplating with copper.

6. The method according to claim 1, wherein the organic silane compound is a silane coupling agent having amino groups and alkoxy groups or a silane coupling agent having alkoxy groups and epoxy groups.

7. The method according to claim 1, wherein the organic silane compound is selected from the group consisting of N-(2-aminoethyl)-3-aminopropyl trimethoxy silane, 3-aminopropyl trimethoxy silane, 2-(trimethoxysilyl)ethyl-2-pyridine, (aminoethyl)-phenethyl trimethoxy silane and γ-glycidyl propyl trimethoxy silane.

8. The method according to claim 1, wherein the step of treating the $SiO_2$ surface of the insulating interlayer portion with the organic silane compound comprises
    dissolving the organic silane compound in a solvent, and
    dipping the insulating interlayer portion into the dissolved organic silane compound.

9. The method according to claim 8, wherein dipping the insulating interlayer portion in the dissolved organic silane compound forms a self-organizing monomolecular layer in chemical bond with the $SiO_2$ surface.

10. The method according to claim 1, wherein the wiring layer is formed directly on the single diffusion prevention layer without catalyzing the surface of the single diffusion prevention layer.

11. The method according to claim 1, wherein the wiring layer comprises copper and is formed by electroless plating.

12. The method according to claim 11, further comprising forming a capping layer directly on the wiring layer without catalyzing the surface of the single diffusion prevention layer.

13. The method according to claim 12, wherein the capping layer comprises a metallic thin film and is formed by electroless plating.

14. The method according to claim 13, wherein the capping layer is formed using the nickel-tungsten-phosphorous bath or the nickel-rhenium-phosphorous bath.

15. The method according to claim 1, wherein the aqueous solution containing the palladium compound is an acidic solution.

16. The method according to claim 15, wherein the acid aqueous solution containing the palladium compound has a pH set at 2 to 6.

* * * * *